United States Patent [19]

Ohmori et al.

[11] 4,255,759

[45] Mar. 10, 1981

[54] COLOR TELEVISION RECEIVER AFPC CIRCUIT

[75] Inventors: Shoji Ohmori, Tachikawa; Atsushi Matsuzaki, Yokohama; Kiyonori Tominaga, Tokyo, all of Japan

[73] Assignee: Sony Corporation, Tokyo, Japan

[21] Appl. No.: 957,740

[22] Filed: Nov. 6, 1978

[30] Foreign Application Priority Data

Nov. 11, 1977 [JP] Japan ................................ 52/135943

[51] Int. Cl.³ .............................................. H04N 9/46
[52] U.S. Cl. .......................................... 358/19; 358/23
[58] Field of Search ........................ 358/17, 19, 23, 8; 178/69.1; 328/59, 63, 133, 134; 331/1, 20, 172, 2

[56] References Cited

U.S. PATENT DOCUMENTS

| | | | |
|---|---|---|---|
| 3,637,936 | 1/1972 | Krause | 358/19 X |
| 4,090,215 | 5/1978 | Buchan et al. | 358/8 |
| 4,127,866 | 11/1978 | Yamashita | 358/19 |
| 4,157,565 | 6/1979 | Kumiyoshi et al. | 358/8 |

*Primary Examiner*—Robert L. Richardson
*Attorney, Agent, or Firm*—Lewis H. Eslinger; Alvin Sinderbrand

[57] ABSTRACT

A color television receiver includes an automatic phase control circuit (which will be hereinafter referred to simply as an APC circuit) with a voltage controlled oscillator for controlling the phase of a reference carrier supplied to a color demodulator so that the phase and frequency of the reference carrier are locked to those of a color burst signal. In addition to the APC circuit, an auxiliary frequency control loop drives the frequency of the voltage controlled oscillator until its frequency falls within the lock-in range of the APC loop. The auxiliary frequency control loop includes a counter circuit for counting cycles of the output signal of the voltage controlled oscillator during a reference time interval and a decoding circuit for decoding the output of the counter circuit to produce an auxiliary control signal for frequency control of the voltage controlled oscillator.

26 Claims, 17 Drawing Figures

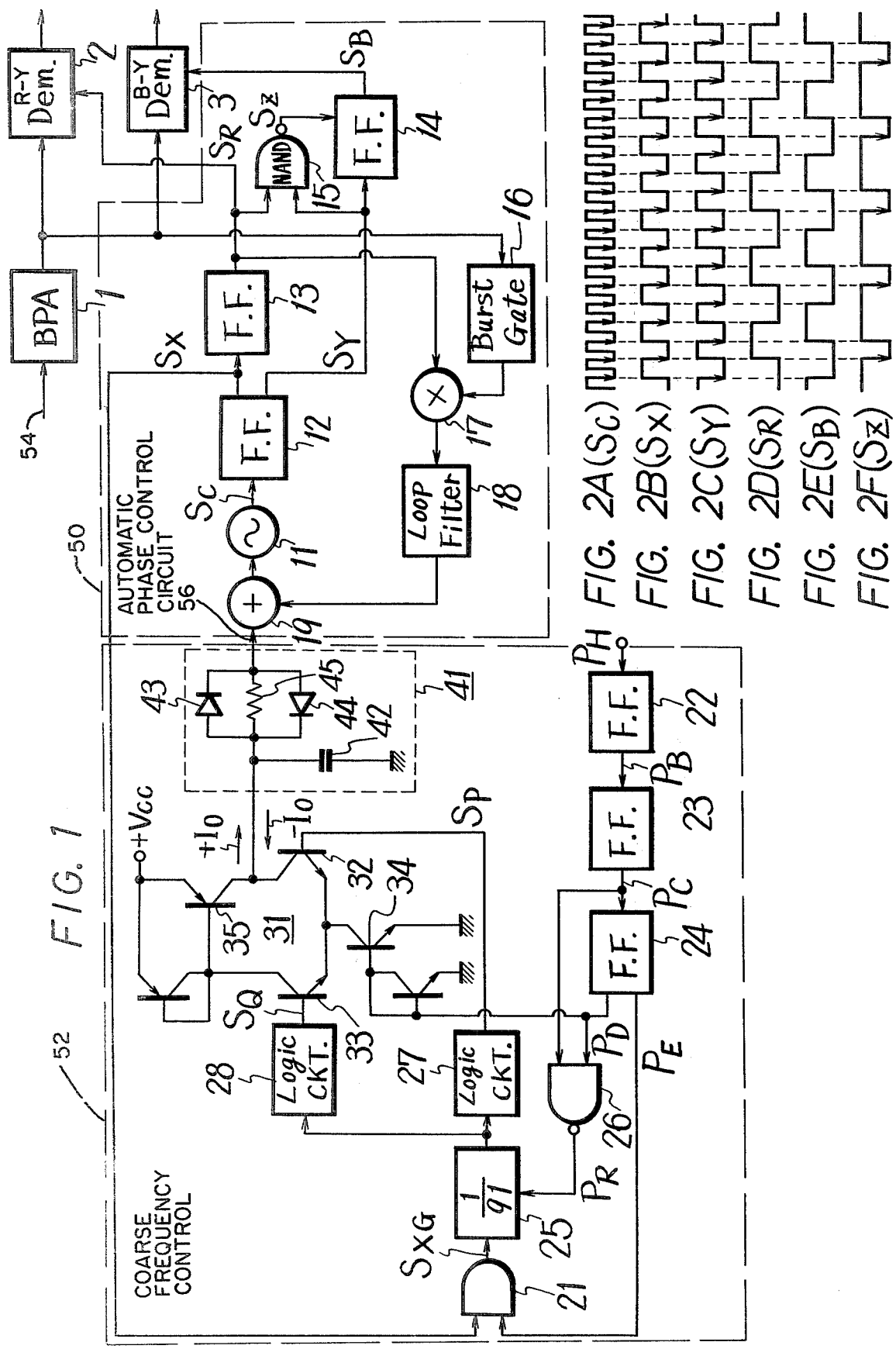

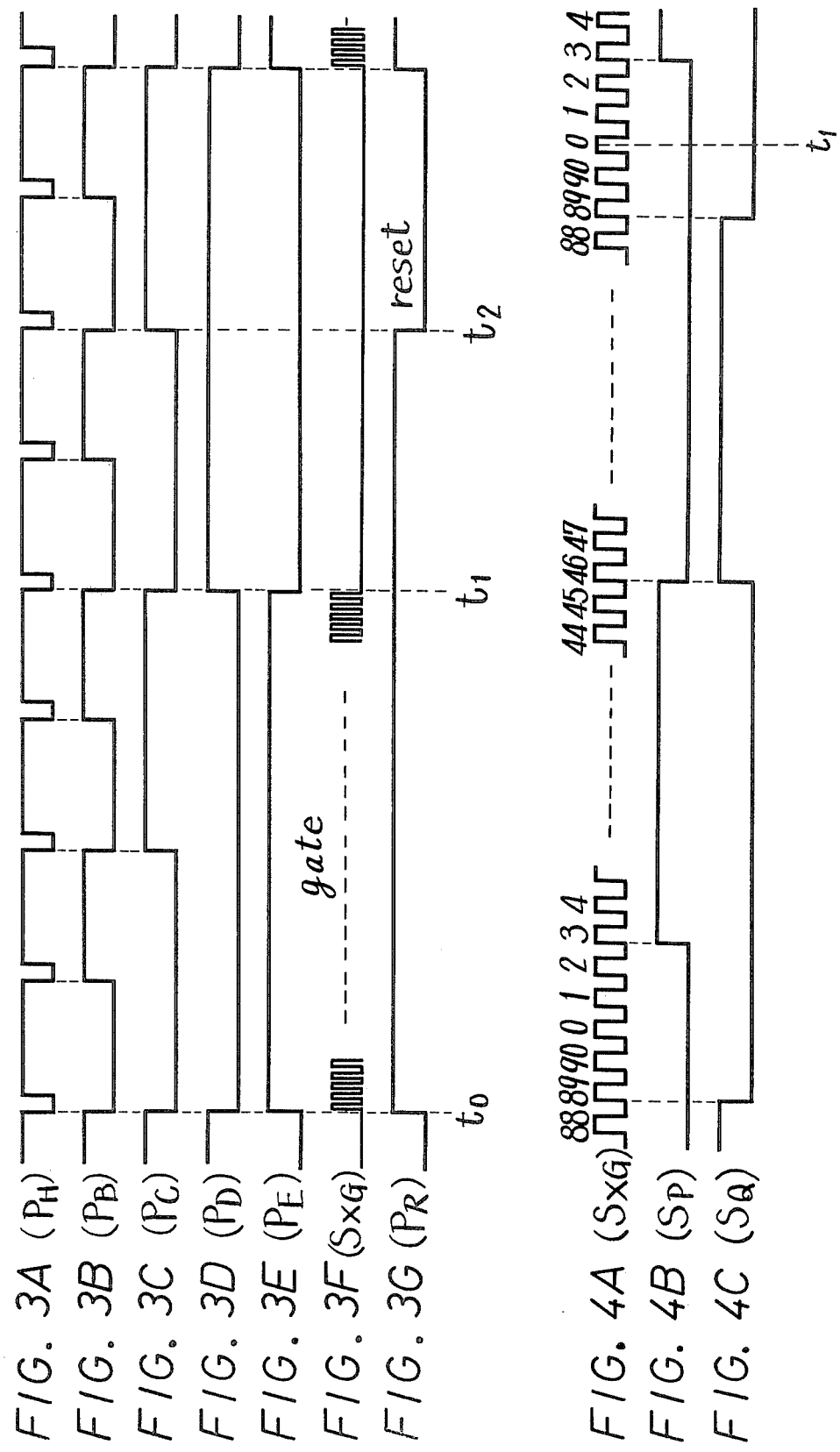

COLOR TELEVISION RECEIVER AFPC CIRCUIT

BACKGROUND OF THE INVENTION

1. Field of the Invention

The present invention relates generally to a color television receiver, and is directed more particularly to a color television receiver with an automatic phase control (APC) circuit.

2. Description of the Prior Art

In a prior art color demodulating circuit for use with a color television receiver, an APC circuit, employs a color burst signal derived from a color television signal to be demodulated as a reference for the APC circuit. The phase of the burst signal is compared with the phase of signal from a voltage controlled oscillator (which will be hereinafter referred simply to as a VCO). The phase of the signal from VCO is controlled by the compared error voltage. The VCO signal is frequency divided fed to a demodulator as a sub-carrier signal for demodulation.

APC circuits have a limited frequency range over which they can acquire and lock in the VCO signal. If the deviation of the frequency of the VCO exceeds the lock-in range of the APC circuit, APC operation is not performed. In the prior art, the VCO must be very stable using, for example, an expensive quartz crystal oscillator. APC circuits having wide lock-in range may be used, but such APC circuits generally require response times which are too long to be practical.

OBJECTS AND SUMMARY OF THE INVENTION

Accordingly, it is an object of the present invention to provide a novel color television receiver free from the defects inherent in the prior art.

It is another object of the invention to provide a color television receiver in which a simple coarse frequency control circuit is additionally used with a VCO, which may be relatively unstable in frequency. This permits the use of an inexpensive CR oscillator for example instead of the more expensive quartz crystal controlled oscillators. Hence the cost of a color television receiver can be made reduced.

These objects are accomplished by providing a reference carrier generator for generating at least one reference signal having a frequency and phase controlled to the frequency and phase of a color burst component of a color television signal comprising: automatic phase control means having an output signal relatd to the at least one reference signal and means for controlling the phase of the output signal in relation to the phase difference between the output signal and the colorburst component; coarse frequency control means for producing a frequency control signal for application to the automatic phase control means which is variable in dependence upon a difference between the frequency of a second output of the automatic phase control means and a predetermined frequency, the frequency control signal being operative to vary the frequency of the output signal toward coincidence with the frequency of the color burst component.

The coarse frequency control circuit gates pulses of a first frequency into a counter using an output frequency derived from a VCO gated with another signal having a known frequency. At the end of a predetermined number of cylces of one of the two frequencies, the content of the counter is examined to determine whether too many or too few pulses are counted. If too many or too few pulses are counted, a voltage is generated which adjusts the VCO frequency upward or downward until it arrives within the lock-in range of the APC employing the color burst signal as a reference. The APC thereupon assumes control of the VCO and phase locks the VCO to the color burst signal.

According to a feature of the invention, the output of the VCO, which is suitably 4 times the color burst frequency counted down by 2, is gated into a divide-by-91 counter over a period of four horizontal line intervals. If the VCO frequency is exactly correct, exactly 20 cycles of the divide-by-91 counter are completed in the four horizontal intervals. The divide-by-91 counter, initially reset to zero, should therefore again be reset to zero at the end of the 20th cycle. If the divide-by-91 counter has been advanced into its 21st cycle because of too many pulses, or has not completed its 20the cycle because of too few pulses, the residue in the divide-by-91 counter causes an appropriate correction signal to be generated by a current converting circuit which is integrated in an integrating circuit to provide a correction voltage tending to drive the output derived from the VCO frequency into coincidence with the frequency of the color burst signal.

The VCO signal may optionally be divided down by 2 or more and gated into a divide-by-n counter with a higher frequency signal of known frequency. For example, the video intermediate frequency, stabilized by automatic fine tuning in a television receiver, may be used as the signal with a known frequency. Thus a number of cylces of the video intermediate frequency signal are gated into the divide-by-n counter over a fixed number of VCO cycles. At the end of the fixed number of VCO cycles, counting is stopped and the number stored in the divide-by-n counter is used as before to determine whether the VCO signal is too high, too low or within range.

According to a further feature of the present invention, there is provided a reference carrier generator for a color television receiver having a color demodulator comprising a voltage controlled oscillator, operative to supply a reference carrier to the color demodulator, phase comparator means for comparing phases of an output of the voltage controlled oscillator and a color burst signal in a color television signal, an output of the phase comparator being supplied to the voltage controlled oscillator as a first control signal, gating means for gating an output of the voltage controlled oscillator with a reference signal which has a known frequency substantially different from said output, reset signal generator means for generating a reset signal during part of one cycle of the reference signal, counter means for counting an output of the gating means and being reset by the reset signal, and decoding means responsive to an output of the counter means for generating a second control signal supplied to the voltage controlled oscillator said second signal being effective to change the frequency of the voltage controlled oscillator.

The above, and other objects, features and advantages of the present invention will become apparent from the following description read in conjunction with the accompanying drawings.

BRIEF DESCRIPTION OF THE DRAWINGS

FIG. 1 is a block and systematic diagram showing, a color demodulating circuit used in the color television receiver according to an embodiment of the present invention; and FIGS. 2A to 2F, 3A to 3G, and 4A to 4C are respectively waveform diagrams referred to in explaining the operation of the embodiment of the invention shown in FIG. 1.

DESCRIPTION OF THE PREFERRED EMBODIMENT

Referring to FIG. 1, a color television signal at terminal 54 is applied to a band pass amplifier 1. Band pass amplifier 1 passes the band of frequencies centered on 3.58 MHz containing the color information and the color burst signal. The signal from band pass amplifier 1 is applied to an automatic phase control circuit 50, a R-Y demodulator 2 and B-Y demodulator 3. APC circuit 50 generates first and second quadrature signals $S_R$ and $S_B$ phase locked to the color burst signal from band pass amplifier 1. First and second quadrature signals $S_R$ and $S_B$ are connected to R-Y and B-Y demodulators 2 and 3 respectively where they are used to demodulate the color difference signal R-Y and B-Y.

A pulse signal $S_X$ which is related to the signals $S_R$ and $S_B$ is coupled from automatic phase control circuit 50 to a coarse frequency control circuit 52. The horizontal synchronizing pulses $P_H$ are also applied to coarse frequency control circuit 52. The number of pulses $S_X$ which occur over a predetermined number of pulses $P_H$ are counted in divide-by-91 counter 25. At the end of the predetermined number of horizontal synchronizing pulses $P_H$, counting is stopped and the number then existing in the divide-by-91 counter 25 is examined to determine whether the stored number is too high to too low. If the stored number is too high or too low, a frequency correction signal 56 is applied to automatic phase control circuit 50 to adjust the frequency downward or upward as required to bring the frequency of $S_X$ into the capture range of automatic phase control circuit 50. Once signal $S_X$ has been adjusted into the capture range, APC circuit 50 controls the frequency and phase of signal $S_X$ according to the frequency and phase of the color burst signal. As a result of signal $S_X$ being frequency and phase controlled to the color burst signal, the first and second quadrature signals $S_R$ and $S_B$ derived therefrom are also phase controlled in relation to the color burst signal.

A VCO 11 in APC circuit 50 produces a signal $S_C$ (refer to FIG. 2A) having a frequency of 4 $f_{SC}=910 f_H$, where the color sub-carrier frequency is taken as $f_{SC}(=3.58MH_z)$ and the horizontal frequency is taken as $f_H$, respectively. The signal $S_C$ from VCO 11 is applied to a flip-flop circuit 12 to trigger the latter at the negative going trailing edge of the signal $S_C$. Flip-flop circuit 12 produces signals $S_X$ and $S_Y$ whose frequency is 2 $f_{SC}=455 f_H$ which are opposite in the phase as shown in FIGS. 2B and 2C, respectively. Signals $S_X$ and $S_Y$ are applied to flip-flop circuits 13 and 14 to trigger the latter at the trailing edges of the signals $S_X$ and $S_Y$, respectively. Flip-flop circuits 13 and 14 produce signals $S_R$ and $S_B$ whose frequency is $f_{SC}$ and which are shifted in phase by 90° as shown in FIGS. 2D and 2E, respectively. Signals $S_Y$ and $S_R$ are fed to a NAND gate 15 so that NAND gate 15 produces a signal $S_Z$ shown in FIG. 2F. Signal $S_Z$ is applied to flip-flop circuit 14 to control the latter, so that the signal $S_B$ therefrom is delayed by 90° from the signal $S_R$ from flip-flop circuit 13. Signals $S_R$ and $S_B$ are fed to the demodulators 2 and 3 as demodulating signals, respectively.

The color television signal from band pass amplifier 1 is also fed to a burst gate circuit 16 which then passes therethrough a color burst signal contained in the color television signal. This color burst signal is fed to a phase comparator 17 to be phase-compared at the appropriate time with signal $S_R$ from flip-flop circuit 13. An error voltage from phase comparator 17, proportional to the phase error between signals at its inputs, is applied through a loop filter 18 and an adder 19 to VCO 11 to control the oscillation frequency of the latter until signal $S_R$ agrees in frequency and phase with the color burst signal. When thus properly phase controlled, signal $S_R$ from flip-flop circuit 13 becomes a demodulating signal for the R-Y axis and signal $S_B$ from flip-flop circuit 14 becomes a demodulating signal for the B-Y axis, respectively.

The pulse signal $S_X$ from flip-flop circuit 12 is also fed to one input of an AND gate 21 at the input of coarse frequency control circuit 52. Horizontal synchronizing signal $P_H$ (refer to FIG. 3A) is applied to a flip-flop circuit 22 which then produces a signal $P_B$ which is triggered every horizontal interval as shown in FIG. 3B. Thus signal $P_B$ is fed to a flip-flop circuit 23 which then produces a signal $P_C$ which is triggered every two horizontal interval as shown in FIG. 3C. This signal $P_C$ is applied to a flip-flop circuit 24 which is triggered every four horizontal intervals to produce signals $P_D$ and $P_E$ which are opposite in phase as shown in FIGS. 3D and 3E, respectively. Signal $P_E$ is applied to a second input of AND gate 21. And gate 21 produces a pulse signal $S_{XG}$ which is the pulse signal $S_X$ from flip-flop circuit 12 during the interval when signal $P_E$ is "1". Thus, signal $S_{XG}$ occurs during the first four horizontal intervals in every set of 8 horizontal intervals as shown in FIG. 3F.

Pulse signal $S_{XG}$ derived from AND gate 21 is counted in a divide-by-91 counter 25. Signals $P_C$ and $\overline{P_C}$ from flip-flop circuits 23 and 24 respectively are fed to a NAND gate 26 which produces a reset signal $P_R$ which is 37 0" in the last two horizontal intervals in the above 8 horizontal intervals as shown in FIG. 3G. Reset signal $P_R$ is fed to divide-by-91 counter 25 to reset it while signal $P_R$ is "0". The output from divide-by-91 counter 25 is fed to logic circuits 27 and 28 for discrimination.

Logic circuit 27 generates a signal $S_P$ which is "1" during the fifth and sixth horizontal intervals if the number remaining in divide-by-91 counter 25 when stopped at the end of the first four horizontal intervals indicates that the frequency of the VCO is too high. Similarly, logic circuit 28 generates a signal $S_Q$ which is "1" during the fifth and sixth horizontal intervals if the VCO frequency is too low.

A current converting circuit 31 is responsive to signal $S_P$ to $S_Q$ to generate a current signal $-I_O$ or $+I_O$ respectively which is integrated in integrating circuit 41 from cycle to cycle to eventually correct the VCO frequency into a range where both $S_P$ and $S_Q$ are 0. This occurs when divide-by-91 counter 25 is within two input pulses of being reset by the last pulse of $S_{XG}$ and thus contains 89, 90, 0, 1, or 2 during the fifth and sixth horizontal intervals.

Current converting circuit 31 includes a pair of transistors 32 and 33. The emitters of transistors 32 and 33 are connected together to a current source transistor 34. The collector of transistor 32 is connected to the collector of a transistor 35 which also serves as a current source. The output $S_P$ from logic circuit 27 is applied to the base of transistor 32, while the output $S_Q$ from the other logic circuit 28 is applied to the base of transistor 33, respectively. The signal $P_D$ from flip-flop circuit 24 fed to the base of transistor 34, enables the operation of current converting circuit 31. Transistor 34 becomes ON only when the signal $P_D$ is "1". Transistor 34 is enabled to pass a constant current $I_O$ only during the last four horizontal intervals in the set of 8 horizontal intervals after the pulse signal $S_{XG}$ is derived from AND gate 21. However, a "1" on signal $S_P$ or $S_Q$ is also required before the constant current $I_O$ can flow.

Integrating circuit 41 has an integrating capacitor 42 connected to the collector of transistor 32 in current converting circuit 31. Integrating capacitor 42 is also connected to adder 19 through a parallel circuit consisting of oppositely polarized diodes 43, 44 oppositely polarized and a resistor 45 of high resistance value.

Divide-by-91 counter 25 can count input 90 pulses before being reset to zero on the 91st input pulse. Divide-by-91 counter 25 is reset to be zero during the last two horizontal intervals in the above unit of 8 horizontal intervals in preparation for the next set of 8 horizontal intervals. Accordingly, when the pulse $S_{XG}$ is fed from AND gate 21 to divide-by-91 counter 25 at the beginning of the first of the 8 horizontal intervals as shown in FIG. 3, the divide-by-91 counter 25 begins at zero and counts 1, 2, 3, . . . at every pulse $S_{XG}$. When divide-by-91 counter 25 reaches a count of 90, it resets on the next input pulse and continues to count 0, 1, 2, . . . .

Logic circuits 27 and 28 are arranged so that the output $S_P$ from logic circuit 27 is "1" when the content of divide-by-91 counter 25 is 3, 4, . . . 45, and it is "0" when the content of divide-by-91 counter 25 is 46, 47, . . . 89, 90, 0, 1, 2, as shown in FIGS. 4A and 4B. The output $S_Q$ from logic circuit 28 is "1" when the content of divide-by-91 counter 25 is 46, 47, . . . 88, and it is "0" when the content of divide-by-91 counter 25 is 89, 90, 0, 1, 2, . . . 45, as shown in FIGS. 4A and 4C. Accordingly, when the content of divide-by-91 counter 25 is 89, 90, 0, 1, 2, the outputs $S_P$ and $S_Q$ from logic circuits 27 and 28 are both "0", but when the content of divide-by-91 counter 25 is 3, 4, . . . 45, output $S_P$ from the logic circuit 27 is "1" and that $S_Q$ from the logic circuit 28 is "0". When the content of divide-by-91 counter 25 is 46, 47, . . . 88, the output $S_P$ from logic circuit 27 is "0" and $S_Q$ from logic circuit 28 is "1".

As described above, the pulse $S_{XG}$ is applied to divide-by-91 counter 25 from AND gate 21 during the first four horizontal intervals in the set of 8 horizontal intervals. The outputs $S_P$ and $S_Q$ are ineffective during the first four horizontal intervals because the signal $P_D$ is "0" during this time and inhibits current converting circuit 31. During the fifth and sixth horizontal intervals, counting is stopped and signal $P_D$ is "1" thus making current converting circuit 31 responsive to a "1" on output $S_P$ or $S_Q$. At the start of the seventh horizontal interval, divide-by-91 counter 25 is reset by reset pulse $P_R$. Thus the number in divide-by-91 counter 25 is zero during the seventh and eighth horizontal intervals. Thus $S_P$ and $S_Q$ are both "0" during these intervals.

Accordingly, when the oscillation frequency of VCO 11 is exactly $4f_{SC}=910f_H$ and the frequency $f_X$ of the pulse $S_X$ from flip-flop circuit 12 is exactly $2f_{SC}=455f_H$, 1820 pulses $S_{XG}$ are applied to divide-by-91 counter 25 during the first four horizontal intervals. Therefore, during these four horizontal intervals, divide-by-91 counter 25 becomes filled exactly 20 times, and at time $t_1$, when the supply of the pulse $S_{XG}$ from AND gate 21 to divide-by-91 counter 25 is stopped, the content thereof is zero. When the oscillation frequency of VCO 11 is $(910+\frac{1}{4})f_H$ and the frequency $f_X$ of the pulse $S_X$ from flip-flop circuit 12 is $(455+\frac{1}{8})f_H$, exactly 1821 pulses $S_{XG}$ are applied to divide-by-91 counter 25 during the first four horizontal intervals. Thus, when counting is stopped at time $t_1$, divide-by-91 counter 25 contains the count of 1.

As described above, the content of divide-by-91 counter 25 when stopped at time $t_1$ is related to the difference between the frequency of VCO 11 and the desired frequency and hence is similarly related to the frequency $f_X$ of the pulse $S_X$. Accordingly, the state of divide-by-91 counter 25 at the time $t_1$ is related to error in the frequency $f_S$ of the demodulating signals $S_R$ and $S_B$ which are fed from flip-flop circuits 13 and 14 to demodulators 2 and 3, respectively.

The following table shows the relation among the frequency $F_X$ of pulse $S_X$ from flip-flop circuit 12, the frequency $f_S(=\frac{1}{2}f_X)$ of demodulating signals $S_R$ and $S_B$, the state of divide-by-91 counter 25 at time $t_1$, and the states of outputs $S_P$ and $S_Q$ from logic circuits 27 and 28 at time $t_1$.

| $f_X(f_H)$ | 444 | — | 455 | 455 | 455 | 455 | 455 | 455 | 455 | 466 |
|---|---|---|---|---|---|---|---|---|---|---|
| $S_X$ | $-\frac{1}{4}$ | — | $-\frac{3}{4}$ | $-2/4$ | $-\frac{1}{4}$ | | $+\frac{1}{4}$ | $+2/4$ | $+\frac{3}{4}$ | $+\frac{1}{4}$ |
| $f_S(f_H)$ | $\frac{444}{2}$ | | $\frac{455}{2}$ | $\frac{455}{2}$ | $\frac{455}{2}$ | $\frac{455}{2}$ | $\frac{455}{2}$ | $\frac{455}{2}$ | $\frac{455}{2}$ | $\frac{466}{2}$ |
| $S_R, S_B$ | $-\frac{1}{8}$ | — | $-\frac{3}{8}$ | $-2/8$ | $-\frac{1}{8}$ | $(=f_{sc})$ | $+\frac{1}{8}$ | $+2/8$ | $+\frac{3}{8}$ | $+\frac{1}{8}$ |
| counter 25 | 46 | — | 88 | 89 | 90 | 0 | 1 | 2 | 3 | — | 45 |
| $S_P$ (Decrease) | "0" | — | "0" | "0" | "0" | "0" | "0" | "0" | "1" | — | "1" |
| $S_Q$ (Increase) | "1" | — | "1" | "0" | "0" | "0" | "0" | "0" | "0" | — | "0" |

After time $t_1$, no further pulses $S_{XG}$ are applied to divide-by-91 counter 25, during the two horizontal intervals from time $t_1$ to time $t_2$. Divide-by-91, the counter 25 and the outputs $S_P$ and $S_Q$ from the logic circuits 27 and 28 are in the appropriate states shown in the above table according to the content of divide-by-91 counter 25. At time $t_2$, divide-by-91 counter is reset by signal $P_R$.

When the frequency $f_S$ of the demodulating signals $S_R$ and $S_B$ is within a frequency range of from $((455/2)-\frac{1}{8})f_H$ to $((455/2)+\frac{1}{8})f_H$, namely within the frequency range of $\pm\frac{1}{8} f_H \approx 3.93$ KHz centered on $f_{SC}=3.58$ MHz, the outputs $S_P$ and $S_Q$ from logic circuits 27 and 28 in two horizontal intervals from time $t_1$ to time $t_2$ both remain "0". This frequency range is within the lock-in range of automatic phase control circuit 50. Therefore, transistors 32, 33 and 35 in current converting circuit 31 remain OFF. Thus no current is applied to integrating circuit 41 by current converting circuit 31. Accordingly, at this time the voltage applied from integrating circuit 41 through adder 19 to VCO 11 is not changed. That is, when the oscillation frequency of VCO 11 is in the range of $\pm f_H = \pm 15.734$ KH$_z$ centered on 4 $f_{SC} = 910$ $f_H = 14.32$ MH$_z$ and the frequency $f_S$ of the demodulating signals $S_R$ and $S_B$ is in the range of $\pm\frac{1}{4}$ $f_H \approx 3.93$ KH$_z$ centered on $f_{SC} = 3.58$ MH$_z$, the oscillation frequency of VCO 11 and accordingly the frequency $f_s$ of the demodulating signals $S_R$ and $S_B$ are drawn into a predetermined value by the error voltage from phase comparator 17 alone and hence synchronization between demodulation signals $S_R$ and the color burst signal is established.

When the frequency $f_S$ of the demodulating signals $S_R$ and $S_B$ is lower than $((455/8) - \frac{3}{8})f_H$, the output $S_P$ from logic circuit 27 remains "0" during two horizontal intervals from time $t_1$ to time $t_2$, but the output $S_Q$ from logic circuit 28 is "1" during this time. In this condition, transistor 32 in current converting circuit 31 remains in the OFF condition but transistors 33 and 35 are turned ON. As a result, a constant current $+I_0$ is fed from current converting circuit 31 to integrating capacitor 42 in integrating circuit 41. The charge stored in integrating capacitor 42 increases during the time from $t_1$ to $t_2$ at a rate determined by the magnitude of $I_0$ and thus the voltage at the junction of integrating capacitor 42 and parallel diodes 43 and 44 increases. Accordingly, at this time the voltage applied from integrating circuit 41 through adder 19 to VCO 11 becomes high increases and hence the oscillation frequency thereof is raised such that the frequency $f_s$ of the demodulating signals $S_R$ and $S_B$ is moved toward the lock-in frequency range. After one or more cycles of correction during which the voltage across integrating capacitor 42 increases, the VCO frequency is raised to within the lock-in range of the APC circuit.

When the frequency $f_s$ of the demodulating signals $S_R$ and $S_B$ becomes higher than $((455/2) + \frac{3}{8})f_H$, during two horizontal intervals from time $t_1$ to $t_2$, the output $S_P$ from logic circuit 27 is "1" and the output $S_Q$ from logic circuit 28 remains "0". Thus, transistor 32 in current converting circuit 31 is turned ON while transistors 33 and 35 remain OFF. As a result, a negative current $-I_0$ is fed from current converting circuit 31 to integrating circuit 41. The negative constant current $-I_0$ flows from integrating capacitor 42 through transistor 32 partially discharging integrating capacitor 42. Accordingly, at this time the voltage applied from integrating circuit 41 through adder 19 to VCO 11 decreases and hence the oscillation frequency thereof is lowered such that the frequency $f_s$ is drawn toward the APC lock-in frequency range.

During two horizontal intervals after time $t_2$, as described above, divide-by-91 counter 25 is reset and the outputs $S_P$ and $S_Q$ from logic circuits 27 and 28 are both "0", so that no current is fed to integrating circuit 41 and hence the voltage delivered therefrom is not changed.

The above operation is repeated sequentially every 8 horizontal intervals.

According to the above embodiment of the invention, when the oscillation frequency of VCO 11 is within a frequency range of $\pm(45/2) f_H \approx 0.354$ MH$_z$ centered on 4 $f_{SC} = 14.32$ MH$_z$ and the frequency $f_s$ of the demodulating signals $S_R$ and $S_B$ is within the frequency range of $\pm(45/8)$ $f_H \approx 0.0885$ MH$_z$ centered on $f_{SC} = 3.58$ MH$_z$, proper synchronization is achieved. That is, if the frequency variation of VCO 11 is within $\pm(0.354/14.32) \approx \pm 2.5\%$, of the desired frequency lock-in of APC circuit 50 is achievable. It is, of course, clear that if the frequency dividing ratio of divide-by-91 counter 25 is higher than 91, the lock-in range can be furtherwidened. That is, in the above example, divide-by-91 counter 25 is changed to give it a greater capacity and as, for example, a divide-by-182 counter, the capture range can be doubled to $\pm 5\%$. Accordingly, depending upon the accuracy of VCO 11, the frequency dividing ratio of divide-by-91 counter 25 can be selected to compensate for the maximum expected range of deviation of VCO 11 from the desired frequency.

Various modifications can be made in the embodiment shown in FIG. 1 without departing from the scope of the invention. For example, gating signals for the pulse $S_X$ through AND gate 21 and the time when the current is fed to integrating circuit 41 may be formed and timed in a different manner from the above example. Also, the construction of divide-by-91 counter 25 can be changed in accordance with the capacity required. Further, the construction of logic circuits 27 and 28 can be determined in accordance with the construction of divide-by-91 counter 25 and the lock-in frequency range of the APC circuit.

Instead of using the relatively low-frequency horizontal synchronizing pulses $P_H$ to gate a number of VCO pulses into divide-by-91 counter 25, a known frequency higher than the VCO frequency may be gated into divide-by-91 counter 25 by the signal $S_{XG}$. For example, a picture intermediate frequency signal, controlled to a known frequency by automatic fine tuning may be substituted for the signal $S_X$ at the input of AND gate 21.

The above pulses including $P_E$ and $P_R$ are produced in response to the output pulse $S_X$ from VCO 11 which may be substituted for the pulse $P_H$ at the input of flip-flop circuit 22. The pulse $P_E$ gates a picture intermediate frequency into divide-by-91 counter 25 for a time period that depends on the frequency of $S_X$. Thus the time interval from time $t_1$ to $t_2$ is varied, while the frequency of the gated video intermediate frequency signal is constant. Therefore, the number stored in the counter at time $t_2$ again varies in correspondence with the oscillation frequency of VCO 11, and hence discrimination and control of the frequency of VCO 11 in a manner similar to the above example is performed.

According to the present invention, the deviation of the oscillation frequecny of VCO 11 in APC circuit 50 may be allowed to extend the lock-in range of APC circuit 59 by any reasonable amount such as, for example, $\pm 2.5\%$. Therefore expensive quartz crystal oscillators are not required in VCO 11. It is possible to therefore use inexpensive CR oscillators or the like. The circuits which are added in the present invention are all digital circuits which can be made as an integrated circuit at very low cost. Therefore the entire circuit including the low-cost VCO and the added digital circuits can be made inexpensively.

Although the above description is given on a single preferred embodiment of the present invention, it will be apparent that many modifications and variations could be effected by one skilled in the art without departing from the spirits or scope of the novel concepts of the invention. Therefore, the scope or spirits of the invention should be determined by the appended claims.

We claim as our invention

1. A reference carrier generator for a color television receiver having a color demodulator and which receives a color television signal containing a color burst signal, said reference carrier generator comprising:
- a voltage controlled oscillator operative to supply a reference carrier to said color demodulator,
- phase comparator means for comparing phases of an output of said voltage controlled oscillator and the color burst signal in the received color television signal, said phase comparator means supplying a first control signal to said voltage controlled oscillator, said first control signal being effective to change the frequency of said voltage controlled oscillator,
- gating means for gating an output of said voltage controlled oscillator with a reference signal which has a known frequency substantially different from said output,
- reset signal generator means for generating a reset signal during part of one cycle of said reference signal,
- counter means for counting an output of said gating means and being reset by said reset signal, and
- decoding means responsive to an output of said counter means for generating a second control signal supplied to said voltage controlled oscillator, said second control signal being effective to change the frequency of said voltage controlled oscillator.

2. A reference carrier generator according to claim 1, wherein said reference signal is a horizontal synchronizing signal contained in the received color television signal.

3. A reference carrier generator according to claim 1, wherein said decoding means generates a positive and negative control signal in response to the frequency of the output of said voltage controlled oscillator being higher and lower respectively than a predetermined frequency.

4. A reference carrier generator according to claim 3, wherein said decoding means includes first and second differential current sources switched in response to the frequency of the output of said voltage controlled oscillator being higher and lower than the predetermined frequency and a capacitor which is charged and discharged by said differential current sources.

5. Apparatus for producing a synchronized signal having a desired phase and frequency relationship to an input signal, said apparatus comprising:
- an automatic phase control circuit including means for producing a first signal of a variable frequency, means for deriving said synchronized signal from said first signal and feedback means for comparing the phase of said synchronized signal and said input signal and for causing the frequency of said first signal to vary in response to said phase comparison, said feedback means being capable of locking the phase of said synchronized signal into said desired phase relationship with said input signal when the frequencies of said synchronized and said input signals are within a predetermined lock-in range of each other;
- a source of a second signal having a known frequency relation to said input signal;
- gating and counting means for counting the number of cycles of one of said first and second signals occurring during a predetermined number of cylces of the other of said first and second signals;
- logic means for determining whether said counted number of cycles is too high or too low;
- output generating means for generating a first output if said counted number of cycles is too high and for generating a second output if said counted number of cycles is too low;
- and correction means responsive to said first and second outputs operative to generate a correction signal applied to said automatic phase - control circuit, said correction signal being effective in said automatic phase control circuit to correct the frequency of said first signal toward said lock-in range.

6. The apparatus according to claim 5, wherein said gating and counting means includes: a divide-by-n counter; an AND gate connected to an input of said divide-by-n counter; enabling means for enabling said AND gate for said predetermined number of cycles whereby a plurality of cycles of one of said first and second signals are counted in said divide-by-n counter; and said enabling means inhibiting said AND gate for a predetermined time after said predetermined number of cycles.

7. The apparatus according to claim 6, wherein said logic means includes first and second logic circuits connected to said divide-by-n counter, said first logic circuit providing said first output if the number in said divide-by-n counter has a first characteristic which indicates that said first signal is too high in frequency and said second logic circuit providing said second output if the number in said divide-by-n counter has a second characteristic which indicates that said first signal is too low in frequency.

8. The apparatus according to claim 5, wherein said second signal is a synchronizing pulse signal in a television signal.

9. The apparatus according to claim 5, wherein said second signal is an intermediate frequency signal in a television system.

10. The apparatus according to claim 5, wherein said correction means comprises current converting means operative when enabled to generate a first current signal responsive to said first output and a second current signal responsive to said second output; enabling means for inhibiting said current converting means during said predetermined number of cycles and for enabling it thereafter; and integrating means responsive to said first and second current signals to increase and decrease a voltage signal applied to said automatic phase control circuit.

11. A coarse frequency control for a television receiver of the type having an automatic phase control circuit for controlling the phase of a first signal relative to a color burst signal of a color video signal comprising: a counter operative to count pulses; gating means responsive to a second signal having a known frequency relationship to said color video signal so as to gate a signal related to said first signal into said counter for a predetermined period having a known relationship to the frequency of said video signal; logic means effective at the end of said predetermined period to generate a first output if the number of pulses counted by said counter is higher than a first predetermined number and further effective to generate a second output if the number of pulses counted by said counter is lower than a second predetermined number; and means responsive to said first and second outputs to generate a correction signal for correcting the frequency of said first signal.

12. The coarse frequency control according to claim 11, wherein said second signal of known frequency is a television synchronizing signal.

13. The coarse frequency control according to claim 12, wherein said predetermined period is a predetermined number of horizontal intervals.

14. The coarse frequency control according to claim 11, wherein said second signal of known frequency is a television intermediate frequency signal.

15. The coarse frequency control according to claim 14, wherein said predetermined period is a predetermined number of cycles of said first signal.

16. A reference carrier generator for generating at least one reference signal having a frequency and phase substantially equal to the frequency and phase of a color burst component of a color television signal comprising: automatic phase control means having an output signal from which said at least one reference signal is derived and means for controlling the phase of said output signal by comparing the phase of said at least one reference signal with that of said color burst component and varying the frequency of said output signal in response to the result of said phase comparison; coarse frequency control means for producing a frequency control signal for application to said automatic phase control means which is variable in dependence upon a difference between the frequency of said output and a predetermined frequency having a known frequency relationship to said color burst component, said frequency control signal being operative to vary the frequency of said output signal so that the frequency of said at least one reference signal will approach coincidence with the frequency of said color burst component.

17. A reference carrier generator for generating at least one reference signal having a frequency and phase controlled to the frequency and phase of a color burst component of a color television signal comprising: automatic phase control means having an output signal related to said at least one reference signal and means for controlling the phase of said output signal in relation to the phase difference between said output signal and said color burst component; coarse frequency control means for producing a frequency control signal for application to said automatic phase control means which is variable in dependence upon a difference between the frequency of a second output of said automatic phase control means and a predetermined frequency, said coarse frequency control means including counter means for counting input pulses, means for resetting said counter means to zero, gating means for gating pulses of said second output with a signal having a known frequency different from the frequency of said second output; logic means effective at the end of said gating for producing a first control signal in response to a first condition of said counter means, a second control signal in response to a second condition of said counter means and a third control signal in response to a third condition of said counter means, and frequency control signal generating means for increasing said frequency control signal in response to said first control signal, decreasing said frequency control signal in response to said third control signal and maintaining said frequency control signal substantially constant in response to said second control signal, said frequency control signal being operative to vary the frequency of said output signal toward coincidence with the frequency of said color burst component.

18. The reference carrier generator according to claim 17, wherein said counter means is a divide-by-N counter wherein N is integrally related to the number of said pulses occurring during said gating when the frequency of said reference signal is no more than a predetermined frequency from the frequency of said color burst component, said second condition being the content of said divide-by-N counter being within a predetermined number before and after a full count of N.

19. The reference carrier generator according to claim 17, wherein said frequency control signal generating means includes a first current source operative in response to said first control signal to produce a first current having a first polarity, a second current source operative in response to said third signal to produce a second current having a polarity opposite to said first polarity, an integrating capacitor fed by said first and second currents whereby a stored voltage, variable in dependence on said first and second currents, is stored in said integrating capacitor and said stored voltage is said frequency control signal.

20. The reference carrier generator according to claim 17, wherein said known frequency is substantially lower in frequency than said second output of said automatic phase control means.

21. The reference carrier generator according to claim 20, wherein said known frequency is a television synchronizing signal.

22. The reference carrier generator according to claim 21, wherein said gating means includes first, second and third flip-flop circuits in series, said first flip-flop circuit being repetitively triggered by said television synchronizing signal, said second flip-flop circuit being repetitively triggered by an output of said first flip-flop circuit, said third flip-flop circuit being repetitively triggered by an output of said second flip-flop circuit, and a gate receiving one output of said third flip-flop circuit at one input thereof and said second output of said automatic phase control means being fed to a second input of said gate, pulses of said second output being coupled through said gate during an enabling condition of said one output of said third flip-flop circuit, a second output of said third flip-flop circuit being connected to said frequency control signal generating means to prevent the operation thereof during the enabling condition of said one output of said third flip-flop circuit.

23. The reference carrier generator according to claim 16, wherein said automatic phase control means includes a voltage controlled oscillator which is operative to produce a first frequency, frequency divider means for producing said output signal, phase comparator means for comparing the phase of said output signal and said color burst component and for producing an error signal in response to differences therebetween, and said error signal being effective to control said first frequency in a direction which minimizes said error signal.

24. The reference carrier generator according to claim 23, wherein said frequency divider means includes means for producing said second output.

25. The reference carrier generator according to claim 16, wherein said predetermined frequency is substantially higher in frequency than said second output of said automatic phase control means.

26. The reference carrier generator according to claim 25, wherein said predetermined frequency is a television picture carrier requency.

* * * * *